United States Patent
Hoffman et al.

(10) Patent No.: US 6,508,198 B1
(45) Date of Patent: Jan. 21, 2003

(54) AUTOMATIC TUNING IN A TAPPED RF TRANSFORMER INDUCTIVE SOURCE OF A PLASMA REACTOR FOR PROCESSING A SEMICONDUCTOR WAFER

(75) Inventors: Daniel J. Hoffman, Saratoga, CA (US); Peter K. Loewenhardt, San Jose, CA (US); Victor H. Fuentes, Sunnyvale, CA (US); Qiwei Liang, Fremont, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/569,834

(22) Filed: May 11, 2000

(51) Int. Cl.[7] ............................................. C23C 16/507
(52) U.S. Cl. ............................. 118/723 I; 156/345.48; 156/345.51
(58) Field of Search ................. 118/719, 723 AN, 118/723 I, 723 E, 723 MP, 723 R; 156/345; 216/68, 61; 219/121.43, 121.52; 315/111.51; 438/714

(56) References Cited

U.S. PATENT DOCUMENTS

| | | | | |
|---|---|---|---|---|
| 5,234,529 A | * | 8/1993 | Johnson ................... | 118/723 I |
| 5,280,154 A | * | 1/1994 | Cuomo et al. ......... | 219/121.52 |
| 5,429,070 A | * | 7/1995 | Campbell et al. ........ | 118/723 R |
| 5,556,501 A | * | 9/1996 | Collins et al. ............... | 156/345 |
| 5,556,549 A | * | 9/1996 | Patrick et al. ................ | 216/61 |
| 5,643,364 A | * | 7/1997 | Zhao et al. ............... | 118/723 E |
| 5,688,357 A | * | 11/1997 | Hanawa ...................... | 156/345 |
| 5,711,850 A | * | 1/1998 | Okumura et al. ........... | 438/714 |
| 5,897,712 A | * | 4/1999 | Hanawa et al. ........... | 118/723 I |
| 5,904,780 A | * | 5/1999 | Tomoyasu ............... | 118/723 R |
| 6,155,199 A | * | 12/2000 | Chen et al. ............... | 118/723 I |
| 6,190,513 B1 | * | 2/2001 | Forster et al. ......... | 204/192.12 |
| 6,252,354 B1 | * | 7/2001 | Collins et al. .......... | 315/111.51 |
| 6,308,654 B1 | * | 10/2001 | Schneider et al. .......... | 156/345 |

OTHER PUBLICATIONS

J.P. Rayner et al, "Radio frequency matching for helicon plasma sources", J.Vac.Sci.Technol. A 14(4), Jul./Aug. 1996, pp. 2048–2055.*

* cited by examiner

Primary Examiner—Gregory Mills
Assistant Examiner—Rudy Zervigon
(74) Attorney, Agent, or Firm—Robert M. Wallace; Joseph Bach

(57) ABSTRACT

In a plasma reactor for processing a semiconductor wafer having an overhead inductive coil antenna, automatic compensation for the load impedance shift that accompanies plasma ignition is achieved using fixed elements. This is accomplished by applying RF power to an intermediate tap of the coil antenna that divides the antenna into two portions, while permanently suppressing the inductance of one of the two portions to an at least nearly fixed level.

27 Claims, 3 Drawing Sheets

AUTOMATIC TUNING IN A TAPPED RF TRANSFORMER INDUCTIVE SOURCE OF A PLASMA REACTOR FOR PROCESSING A SEMICONDUCTOR WAFER

BACKGROUND OF THE INVENTION

The invention concerns impedance matching between an RF power source and a tapped coil source power applicator of a plasma reactor.

Referring to FIG. 1, a plasma reactor for processing a semiconductor workpiece (e.g., a silicon wafer for fabrication of computer chips) includes a reactor chamber 100 with a ceiling 110, the chamber enclosing a wafer support pedestal 115 for holding a semiconductor wafer 120 during processing. Processing gases are introduced into the chamber 100 through gas inlets 125 and are ionized to form a plasma in the chamber 100 by RF power radiated from an overhead coil antenna 130. The coil antenna 130 consists of at least one coiled conductor wound to form a number of windings. RF power is applied to the antenna 130 by an RF plasma source power generator 135 connected at a tap point 137 on an intermediate winding 140 of the coil antenna 135. The circuit is completed by connecting the antenna's top winding 145 to RF return or ground through a capacitor 150 and connecting the antenna's bottom winding 155 directly to ground. The capacitor 150 is selected to form a resonant circuit with the inductive coil antenna 130 with a resonance near the desired frequency of the RF generator 135. Generally, the load impedance presented by the combination of the coil antenna 130 and the chamber (both before and after plasma ignition) differs from the output impedance of the RF generator 135. The greater the difference in impedance, the more RF power is reflected back to the RF generator and the less power is delivered to the chamber. For this reason, the typical RF generator itself has a limited capability to maintain the forward power at a nearly constant level even as more RF power is reflected back to the generator as the plasma impedance fluctuates. Typically, this is achieved by the generator servoing its output power level, so that as an impedance mismatch increases (and therefore reflected power increases), the generator increases its output power level. Of course, this capability is limited by the maximum output power of which the generator is capable of producing. Typically, the generator is capable of handling a maximum ratio of forward standing wave voltage to reflected wave voltage (i.e., the voltage standing wave ratio or VSWR) of not more than 3:1. If the difference between impedances increases (e.g., due to plasma impedance fluctuations during processing) so that the VSWR exceeds 3:1, then the RF generator can no longer control the delivered power, and control over the plasma is lost. As a result, the process is likely to fail. Therefore, at least an approximate impedance match must be maintained between the RF generator 135 and the load presented to it by the combination of the coil antenna 130 and the chamber 100. This approximate impedance match must be sufficient to keep the VSWR at the generator output within the 3:1 VSWR limit over the entire anticipated range of plasma impedance fluctuations. The impedance match space is, typically, the range of load impedances for which the match circuit can maintain the VSWR at the generator output at or below 3:1.

One difficulty with the reactor of FIG. 1 is that when RF power is first applied, there is no plasma in the chamber 100. Thereafter, the load impedance undergoes a very large abrupt change upon plasma ignition. This is because after plasma ignition the coil antenna induces mirror currents in the plasma which oppose the coil EMF and thereby effectively reduce the coil inductance. This reduction in inductance changes the load impedance of the coil antenna, so that the pre-plasma ignition load impedance significantly differs from the post-plasma ignition load impedance. The difference between the pre-and post-plasma ignition impedances is so great that it is not possible to provide an optimal impedance match prior to and after plasma ignition. This is because, typically, the impedance match space provided by a conventional fixed impedance match circuit is not sufficiently broad to encompass both the pre-ignition load impedance and the post-ignition load impedance. As stated above, the impedance match space is, typically, the range of load impedances for which the match circuit can maintain the VSWR at the generator output at or below 3:1. Even if the match space were sufficiently broad to encompass both the pre- and post-ignition load impedances, the system would have to be carefully tuned since the margin by which the impedance match space could cover both impedances would be relatively narrow. Thus, the useful impedance match space during plasma processing would necessarily be significantly constricted. As a result, the processing window of the reactor is constricted to avoid swings in plasma load impedance which would take the load impedance outside the constricted impedance match space.

Some compromise must be made in the selection of RF frequency, capacitance of the capacitor 150 and antenna inductance so that the VSWR limitations of the RF generator 135 are met both prior to and after plasma ignition. This situation is illustrated in the Smith chart of FIG. 2, in which reactance is plotted on the imaginary vertical axis and resistance is plotted on the real horizontal axis. Z1 is the pre-plasma ignition load impedance and Z2 is the post-plasma load impedance of an exemplary plasma reactor. Their location is a function of the capacitance of the tuning capacitor 150, which must be carefully selected. With such a selection, the load impedances Z1 and Z2, together with the RF generator output impedance Z0 of 50 Ohms, provide reflection coefficients (Z1/Z0 and Z2/Z0, respectively) that do not exceed the 3:1 VSWR capability of the RF generator 150. However, this condition is satisfied by a small margin, so that the system is susceptible to failure during processing occasioned by wide swings in the plasma impedance.

One compromise that can be made (by an appropriate selection of the tuning capacitor etc. in accordance with conventional techniques) is to center the limited impedance match space around the post-ignition load impedance. This provides an optimum match to the post-ignition load impedance to optimize control during processing. It also provides a correspondingly inferior impedance match to the pre-ignition load impedance which must be, however, sufficient to couple enough power to ignite a plasma. Of course, such an arrangement is unreliable. Alternatively, some type of dynamic impedance matching device must be employed, which would increase system cost and complexity.

Therefore, there is a need to provide a fixed impedance match with a sufficiently large match space to accommodate both the pre-ignition load impedance and the post-ignition load impedance.

The present invention provides a way of following the abrupt impedance change characteristic of plasma ignition without a dynamic impedance matching device.

SUMMARY OF THE INVENTION

In a plasma reactor for processing a semiconductor wafer having an overhead inductive coil antenna, automatic compensation for the load impedance shift that accompanies plasma ignition is achieved using fixed elements. This is accomplished by applying RF power to an intermediate tap of the coil antenna that divides the antenna into two portions, while permanently suppressing the inductance of one of the two portions to an at least nearly fixed level. For this purpose, an inductance-suppressing conductive body is held sufficiently close to one of the two portions so as to fix the inductance of the one portion at a suppressed level that is at least nearly constant over plasma ignition, leaving the inductance of the other portion unsuppressed and free to fall when a plasma is ignited and rise when it is extinguished. The resulting change in the ratio of the inductances of the two portions upon plasma ignition automatically compensates for the change in load impedance that occurs upon plasma ignition.

DETAILED DESCRIPTION OF THE PREFERRED EMBODIMENTS

Figure 1:
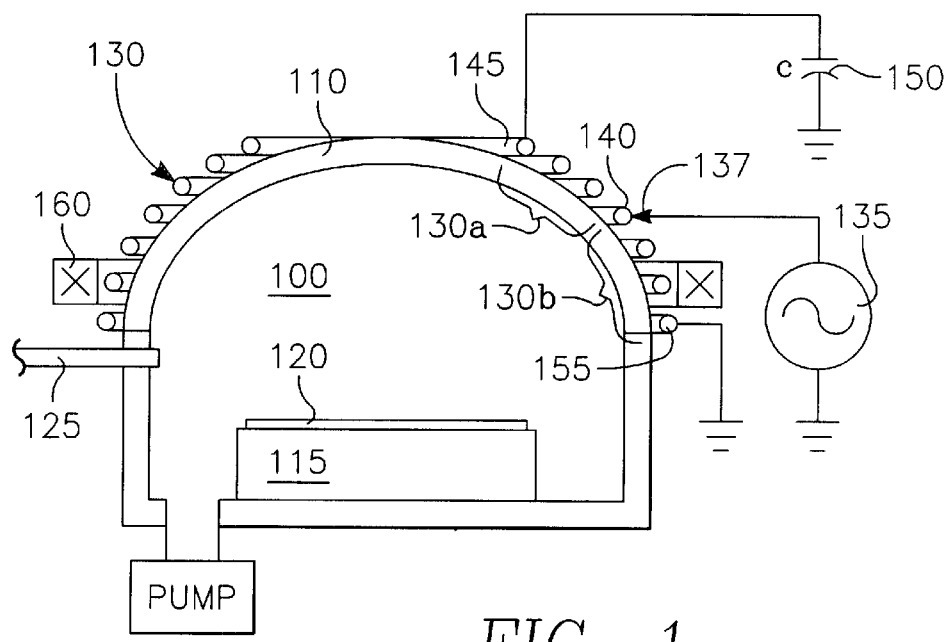
FIG. 1 is a diagram of a plasma reactor embodying the present invention.
Figure 2:
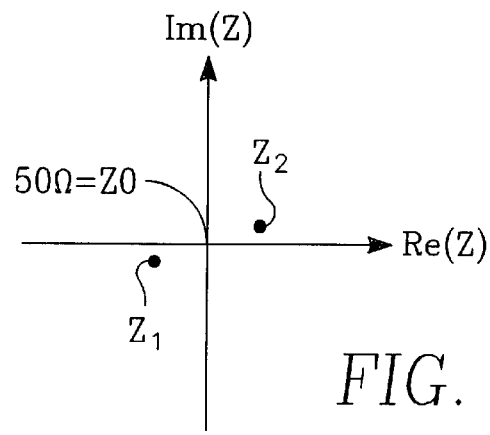
FIG. 2 is a graph chart of a complex plane illustrating the match space of a typical reactor.

Referring to FIG. 1, automatic compensation for the change in load impedance occurring upon plasma ignition is achieved without any moving parts by providing a stationary conductive body 160 (preferably a metal ring) adjacent a selected portion of the coil antenna 130. In the preferred embodiment, the coil antenna 130 is unevenly divided into two portions, namely a longer portion 130*a* and a shorter portion 130*b*, separated at the power input tap 137 on the winding 140, and the conductive body 160 is adjacent the shorter portion 130*b*. The conductive body 160 is sufficiently close to the antenna portion 130*b* so that the inductive field of the antenna portion 130*b* induces mirror currents in the conductive body 160. These mirror currents oppose the induced EMF of the antenna portion 130*b*, which reduces the inductance of the lower antenna portion 130*b*. Since the conductive body is relatively far away from the other antenna portion 130*a*, it has relatively no effect thereon. As will be explained below, this feature automatically reduces (or eliminates) the large shift in load impedance presented by the coil antenna that otherwise occurs upon plasma ignition. As a result, there is less degradation in generator-antenna impedance match upon plasma ignition. The system parameters are selected so that an impedance match exists prior to plasma ignition, and this impedance match is not lost upon plasma ignition. Specifically, the frequency of the generator 135 and the capacitance of the capacitor 150 may be selected for an optimum impedance match that obtains both before and after plasma ignition.

In one exemplary implementation, the antenna 130 consisted of six windings conformal in shape with a multi-radius dome-shaped ceiling, the tap 137 was located about 45" (inches) from the bottom coiled conductor end as measured along the length of the conductor, the effective system capacitance including the capacitor 150 was about 63 micro-farads and the RF generator had a frequency of 2 MHz. The conductive body 160 was of copper metal.

Figure 3:
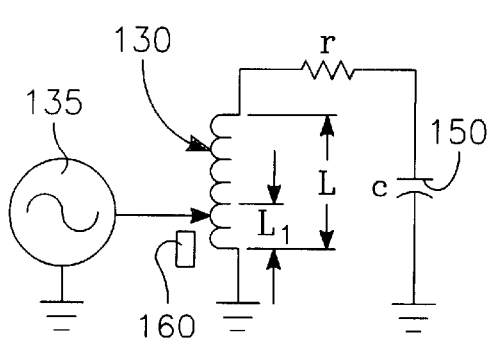
FIG. 3 is an equivalent circuit of the power applicator circuit in the embodiment of FIG. 1 prior to plasma ignition.
Figure 4:
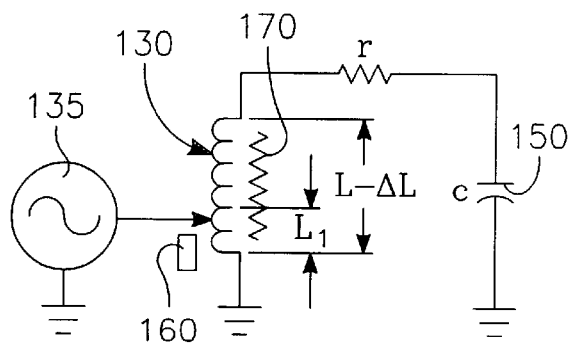
FIG. 4 is an equivalent circuit of the power applicator circuit in the embodiment of FIG. 1 after plasma ignition.

That this is so will now be shown by an analysis of the embodiment of FIG. 1 with reference to the equivalent circuits of FIGS. 3 and 4. FIG. 3 is the equivalent circuit of the embodiment of FIG. 1 prior to plasma ignition. The coil antenna 130 has a total inductance L. The lower antenna portion 130*b* contributes to that total inductance with its own smaller inductance L1. The inductance of the antenna portion 130*b* is smaller because the antenna portion 130*b* is shorter than the remainder of the antenna 130 and is further reduced by the presence of the conductive body 160. The resistance r in FIG. 3 represents the resistive losses in the system prior to plasma ignition. The capacitance C in FIG. 3 is the capacitance of the capacitor 150 in FIG. 1. The load impedance Z presented by the coil antenna 130 to the RF generator 135 is determined by the ratio a of the lower antenna portion inductance L1 to the total coil inductance L, in accordance with the following equation:

$$Z = \alpha^2 [L/Cr] \qquad (1)$$

where:

$$\alpha = L1/L. \qquad (2)$$

FIG. 4 illustrates the situation after plasma ignition. A plasma 170 is now adjacent the coil antenna 130 and acts to a limited extent like a conductor (with a plasma conductivity less than that of metal) in that the inductive field of the coil antenna 130 induces mirror currents in the plasma 170. These mirror currents reduce the inductance of the coil antenna by an amount dL so that the total coil antenna inductance L becomes L−dL. However, the inductance of the lower antenna portion 130*b* adjacent the conductive body 160 is already reduced by the mirror currents in the conductive body 160. Since the conductivity of the plasma is less than that of the conductive body 160, the influence of the plasma on the inductance of the lower antenna portion 130*b* is insignificant or small relative to the effect of the conductive body. Thus, the appearance of the plasma 170 has little or no effect upon the lower antenna portion inductance L1, relative to the reduction in the antenna inductance in the other antenna portion 130*a* caused by the plasma. The conductive body 160 is adjacent only to the lower antenna portion 130*b* so that its effects are localized to that portion and do not affect the inductance of the upper portion 130*a*. Thus, at least to a first approximation, L1 does not change upon plasma ignition, while L experiences a significant change because the other antenna portion 130*a* not covered by the conductivity is more susceptible to a reduction in its inductance by the plasma. As a result, the ratio α=L1/L increases upon plasma ignition because L decreases while L1 remains constant (or at least nearly so). As a result, the decrease in L, which would otherwise cause an abrupt decrease in the load impedance Z, is compensated by the corresponding increase in α. This is because in Equation 1 above the load impedance Z is a function of the product of $α^2$ and L. Since α is squared in this Equation 1, a small increase in a compensates for a large decrease in L. Thus, L1 does not necessarily need to remain constant before and after plasma ignition in order to compensate for the reduction in L upon plasma ignition. The result is that the load impedance Z presented to the RF generator 135 remains more constant than in the prior art, a significant advantage, and can be made to remain at least nearly perfectly constant, depending upon the conductivity, size and proximity of the conductive body to the smaller antenna portion 130b. Accordingly, the match space of the system encompasses both the pre-plasma ignition load impedance and the post-plasma ignition load impedance.

Figure 5:
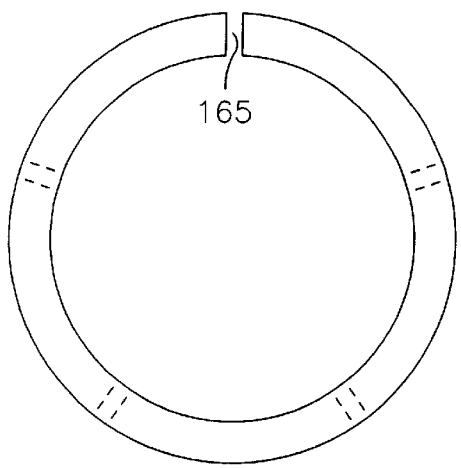
FIG. 5 is a top view of a conductive ring employed in the embodiment of FIG. 1 to render the inductance of certain portions of the inductive power applicator less variant during plasma ignition than other portions.

It is preferable that the conductive body 160 not provide a continuous conductive path around the lower antenna portion 130b because. Otherwise, it is difficult to strike or maintain a stable plasma. Therefore, as illustrated in FIG. 5, there is at least one radial slot 165 across the width of the conductive body 160, and additional slots may be provided as indicated in dashed line in FIG. 5. The conductive body 160 may be a ring of square cross-section as shown in FIGS. 1 and 5. The conductive body 160 should be sufficiently close to the short antenna portion 130b to produce the desired mirror currents in the conductive body 160.

In one embodiment, the conductive body 160 was separated from the lower antenna portion 130b by one skin depth of the inductive field of the coil antenna 130. The skin depth is a well-known function of the frequency of the RF generator and other parameters and is readily computed by the skilled worker. In the preferred embodiment, the conductive body 160 was within about one inch of the short antenna portion 130b for an RF frequency of about 2 MHz. At this close distance, the effect of the conductive body 160 on the short antenna portion 130b is maximized. Moreover, at such a close distance to the lower antenna portion 130b, the distance between the conductive body 160 and the longer antenna portion 130a is comparatively much longer and therefore its effect on the longer antenna portion 130a is relatively insignificant or reduced. Thus, the inductance of the upper antenna portion 130a is free to change upon plasma ignition while the inductance of the lower portion 130b is fixed at a nearly constant value by the conductive body 160.

Figure 7:
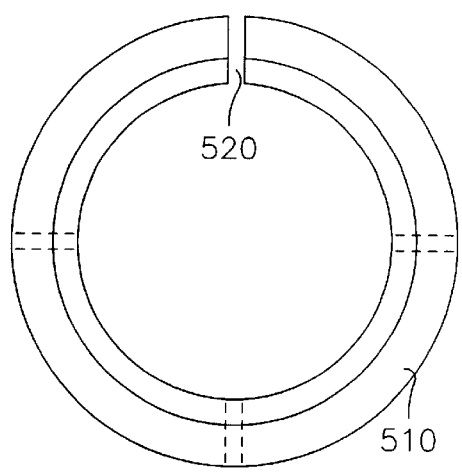
FIG. 7 is top view of the conductive body employed in the embodiment of FIG. 6.
Figure 6:
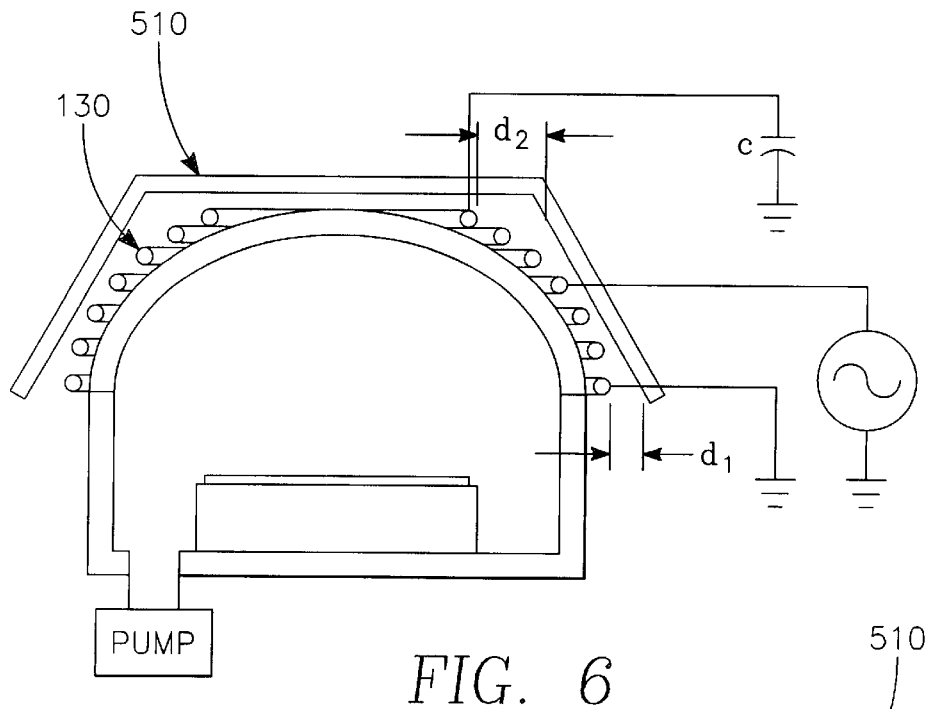
FIG. 6 is a diagram of one alternative embodiment of the invention.
Figure 8:
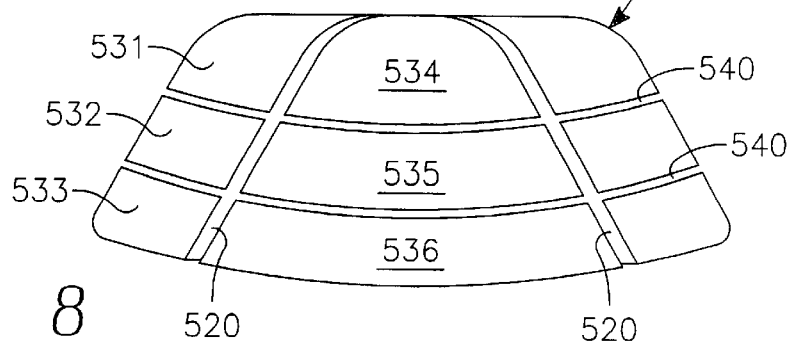
FIG. 8 is a diagram of a variation of the alternative embodiment of FIG. 6.

While in the preferred embodiment of FIG. 1 the conductive body 160 faces only the lower antenna portion 130b to achieve the differential response of the two antenna portions 130a, 130b to the plasma, a differential response may also be achieved in an embodiment in which a conductive body faces both antenna portions 130a, 130b. This is accomplished by sculpting the conductive body so that its spacing relative to the two antenna portions is different. For example, in the alternative embodiment of FIG. 6, a conductive body 510 is a tapered cylindrical sheet that faces or covers nearly the entire coil antenna 130. However, the conductive body 510 is shaped so that it tapers away from the top of the antenna 130 and towards the bottom of the antenna 130 so that, on average, it is closer to the shorter antenna portion 130b at the bottom and farther away from the longer antenna portion 130a that extends to the top. In this embodiment, the coil antenna 130 has a dome shape so that the tapered cylindrical shape (a truncated cone shape) of the conductive body 510 achieves the desired differential spacing of the conductive body 510 relative to the two antenna portions 130a, 130b. Referring to the top view of FIG. 7, the conductive body 510 preferably is separated by at least one axial slit 520 extending along its entire axial length, although additional axial slits may be provided as indicated in dashed line. Referring to the side view of FIG. 8, the conductive body 510 may be separated into an array of conductive sub-bodies 531, 532, 533, etc., by at least one axial slit 520 and at least one circumferential slit 540, although more than one axial slit and more than one circumferential slit may be provided. The respective displacements of the individual sub-bodies are each selected to provide the above-described differential responses of the two antenna portions 130a, 130b to the plasma. In the embodiment of FIG. 8, the configuration of the conductive sub-bodies conforms to the tapered cylindrical shape of FIG. 6. The array of sub-bodies may cover all of the coil antenna 130 (as illustrated in FIG. 8) or may leave selected portions uncovered in other alternative embodiments.

Figure 9:
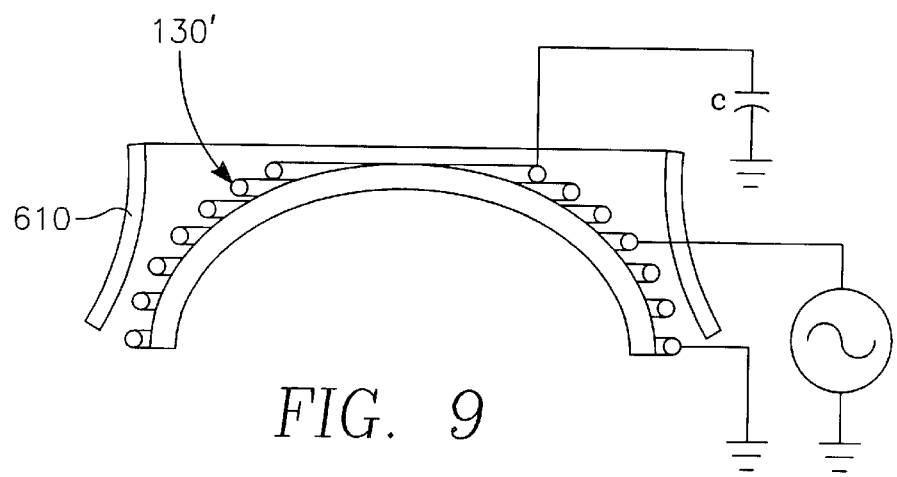
FIG. 9 is a diagram of another alternative embodiment of the invention.
Figure 10:
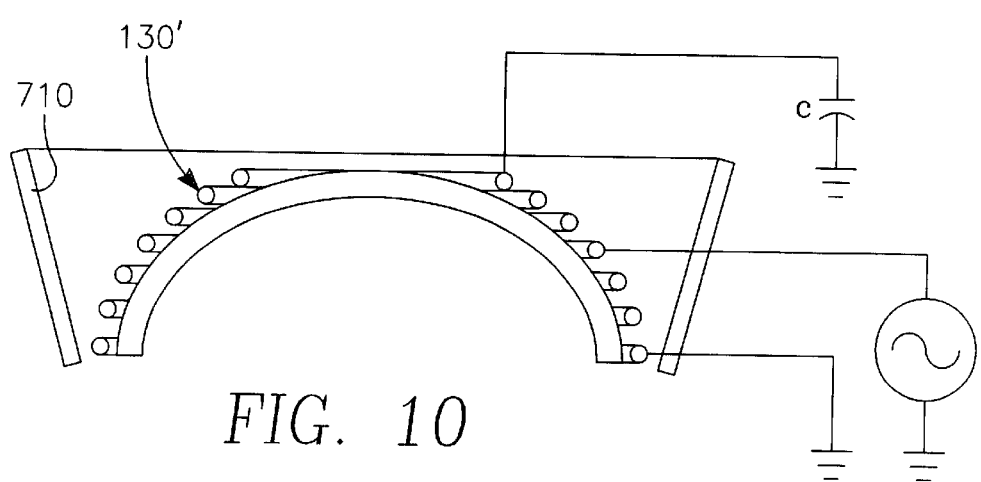
FIG. 10 is a diagram of a further alternative embodiment of the invention.

The invention is not confined to a coil antenna having a particular shape (such as the dome shape of the foregoing embodiments), but is adaptable to other coil antenna shapes. For example, in the alternative embodiment of FIG. 9, the coil antenna 130' has a tapered cylindrical shape (a truncated cone shape). In this case, a conductive body 610 having a curved cross-sectional shape that curves outwardly away from the top of the antenna 130' achieves the desired differential spacing with respect to the top and bottom antenna portions 130'a, 130'b. In the alternative embodiment of FIG. 10, a conductive body 710 has a tapered cylindrical shape that is tapered differently from the tapered cylindrical shape of the coil antenna 130'. In FIG. 10, the conductive body 710 actually is tapered oppositely from the coil antenna 130', although this may not be necessary in other embodiments. Specifically, the conductive body 710 tapers outwardly from bottom to top, while the coil antenna 130' tapers inwardly from bottom to top. As in the embodiments of FIGS. 6, 7 and 8, the conductive bodies in the embodiments of FIGS. 9 and 10 may be separated by one or more axial slits and/or circumferential slits in the manner of FIGS. 7 or 8.

Figure 11:
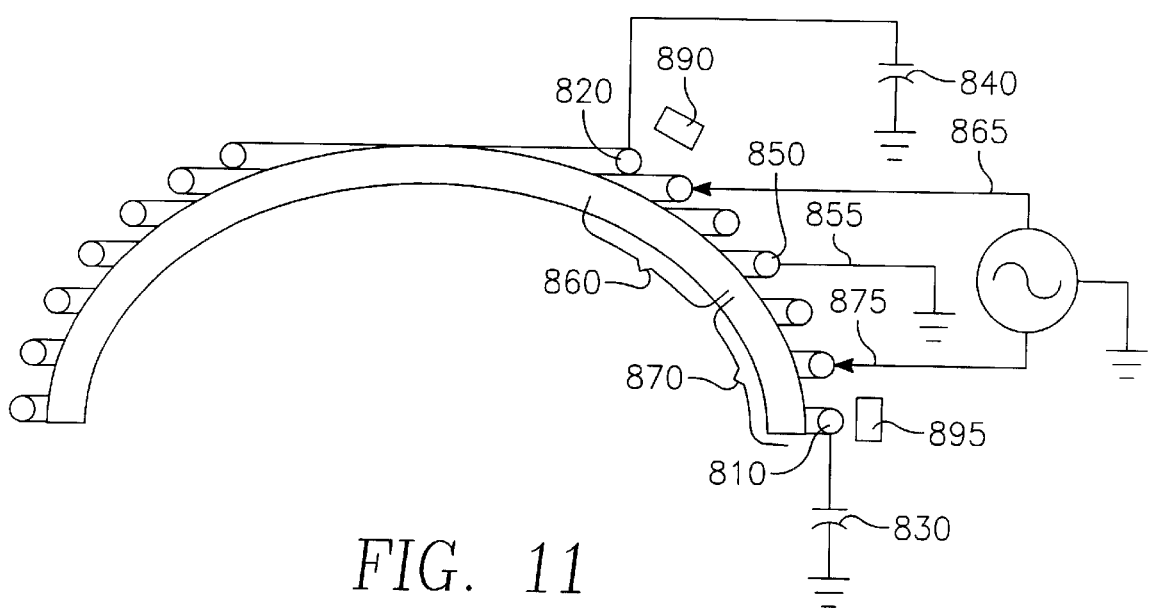
FIG. 11 is a diagram of a still further alternative embodiment of the invention.

The invention is not limited to a coil antenna having a single power input tap (e.g., the tap 137 of FIG. 1). For example, a coil antenna may have more than one power input tap, as in the embodiment of FIG. 11. In FIG. 11, a coil antenna consisting of a single coiled conductor 800 has its top and bottom terminating ends 810, 820 connected to RF return (ground) through respective tuning capacitors 830, 840, and one of its intermediate windings 850 connected directly to ground at a middle ground tap 855. The coil antenna 800 is thus divided into two sections by the middle ground tap 855, namely an upper section 860 an lower section 870. RF power is applied to the coil antenna 800 at a power input tap to each of the two sections. Specifically, an RF generator 880 applies RF power to a upper tap 865 connected to a winding in the upper coil section 860 and to a lower tap 875 connected to a winding in the lower coil section 870. The upper coil section 860 is thus divided into an upper portion 860a and a lower portion 860b, the division preferably being uneven so that the upper portion 860a is shorter than the lower portion 860b. Similarly, the lower coil section 870 is divided into an upper portion 870a and a lower portion 870b, the division preferably being uneven so that the upper portion 870a is shorter than the lower portion 870b. In the manner of FIG. 1, conductive bodies 890, 895 are placed adjacent the two shorter portions 860a, 870a, of the respective antenna sections 860, 870. The circuits of the upper and lower sections 860, 870 including their respective conductive bodies 890, 895 mirror one another and replicates the individual circuit of the embodiment of FIG. 1. Thus, the upper and lower antenna sections with their respective conductive bodies act to automatically compensate for the shift in plasma impedance that occurs upon plasma ignition in the manner described above with respect to FIG. 1.

The result is that the match space of the system is greatly extended to encompass both the pre-plasma ignition load impedance and the post-plasma ignition load impedance. Thus, no compromise is necessary in providing a match space under either condition. Heretofore, the match space during plasma processes was necessarily limited by the necessity of such a compromise. One advantage of the invention is that, with the elimination of any compromise in match space, the entire match space may be optimized for plasma processing (i.e., for the post-plasma ignition load impedance), so that the process window of the reactor is greatly expanded. With such an expanded process window, the reactor performance is more reliable and versatile and is susceptible of a broader range of process recipes, a significant advantage.

While the invention has been described in detail by specific reference to preferred embodiments, it is understood that variations and modifications thereof may be made without departing from the true spirit and scope of the invention.

What is claimed is:

1. A plasma reactor, comprising:
   a reactor chamber including a wafer support for holding a semiconductor wafer for processing and a process gas supply inlet;
   an RF power generator having an output terminal and a return terminal;
   an inductive antenna comprising a coiled conductor adjacent said reactor chamber having first and second spaced apart ground taps coupled to said return terminal of said generator and an intermediate power input tap between said ground taps, said intermediate tap connected to said output terminal and defining first and second portions of said antenna on respective sides of said intermediate tap;
   an inductance-suppressing conductive body sufficiently closer to one of said portions of said antenna than it is to the other of said portions to provide greater suppression of the inductance of the one portion and lesser suppression of the inductance of the other portion; and
   wherein said conductive portion comprises a metal ring at least nearly coaxial with an axis of symmetry of said coiled conductor, said ring having a length along said axis corresponding to an axial length of said one portion of said antenna.

2. The reactor of claim 1 wherein said intermediate power input tap is located unsymmetrically with respect to the two ends of said antenna wherein the one portion having its inductance suppressed by the conductive body is shorter in length than the other portion.

3. The reactor of claim 1 further comprising a slit through said ring, whereby said ring does not completely encircle said one antenna portion.

4. The reactor of claim 1 wherein said ring is separated from said one portion of said antenna by about one skin depth of an inductive field of said antenna at a selected frequency of said RF generator.

5. The reactor of claim 1 wherein said conductive body is sufficiently close to said one portion of said antenna to fix the inductance of said one portion at a level that is at least nearly constant over plasma ignition.

6. The reactor of claim 1 wherein said conductive body is placed sufficiently closer to the one antenna portion than to the other portion so that a plasma in said chamber has relatively little effect upon the inductance of said one portion compared to its effect upon the inductance of the other portion of said antenna.

7. The reactor of claim 1 wherein said conductive body further comprises an array of plural conductive elements.

8. The reactor of claim 1 wherein said chamber comprises an overhead ceiling facing said wafer support, and wherein said antenna is placed on an external side of said ceiling and faces said wafer support through said ceiling, said conductive body being placed on a side of said antenna opposite said ceiling.

9. The reactor of claim 8 wherein said antenna conforms generally to the shape of an external surface of said ceiling.

10. The reactor of claim 1 wherein said ring has a rectangular cross-sectional shape.

11. The reactor of claim 1 further comprising:
   a third ground tap spaced from said second ground tap and coupled to said return terminal of said generator, said second ground tap being a middle tap of said coil conductor;
   a second intermediate power input tap between said second and third ground taps, said intermediate tap connected to said output terminal and defining third and fourth portions of said antenna on respective sides of said second intermediate power input tap; and
   a second inductance-suppressing conductive body sufficiently close to a selected one of said third and fourth portions of said antenna to suppress the inductance of the selected one portion without fixing the inductance of the other portion.

12. A plasma reactor, comprising:
   a reactor chamber including a wafer support for holding a semiconductor wafer for processing and a process gas supply inlet;
   an RF power generator having an output terminal and a return terminal;
   an inductive antenna comprising a coiled conductor adjacent said reactor chamber having first and second spaced apart ground taps coupled to said return terminal of said generator and an intermediate power input tap between said ground taps, said intermediate tap connected to said output terminal and defining first and second portions of said antenna on respective sides of said intermediate tap;
   an inductance-suppressing conductive body sufficiently closer to one of said portions of said antenna than it is to the other of said portions to provide greater suppression of the inductance of the one portion and lesser suppression of the inductance of the other portion; and
   further comprising an axial slit in said conductive body.

13. The reactor of claim 12 wherein said conductive body defines a surface that is spaced closer to one portion and further from the other portion.

14. The reactor of claim 13 wherein said surface of said conductive body has a three-dimensional shape that tapers toward one portion and away from the other portion.

15. The reactor of claim 13 wherein said surface is coaxial with an axis of symmetry of said antenna.

16. A plasma reactor, comprising:
   a reactor chamber including a wafer support for holding a semiconductor wafer for processing and a process gas supply inlet;
   an RF power generator having an output terminal and a return terminal;

an inductive antenna comprising a coiled conductor adjacent said reactor chamber having first and second spaced apart ground taps coupled to said return terminal of said generator and an intermediate power input tap between said ground taps, said intermediate tap connected to said output terminal and defining first and second portions of said antenna on respective sides of said intermediate tap;

an inductance-suppressing conductive body sufficiently closer to one of said portions of said antenna than it is to the other of said portions to provide greater suppression of the inductance of the one portion and lesser suppression of the inductance of the other portion;

an axial slit in said conductive body; and wherein said conductive body comprises an array of separate conductive sub-bodies.

17. A plasma reactor, comprising:

a reactor chamber including a wafer support for holding a semiconductor wafer for processing and a process gas supply inlet;

an RF power generator having an output terminal and a return terminal;

an inductive antenna comprising a coiled conductor adjacent said reactor chamber having first and second spaced apart ground taps coupled to said return terminal of said generator and an intermediate power input tap between said ground taps, said intermediate tap connected to said output terminal and defining first and second portions of said antenna on respective sides of said intermediate tap;

an inductance-suppressing conductive body sufficiently closer to one of said portions of said antenna than it is to the other of said portions to provide greater suppression of the inductance of the one portion and lesser suppression of the inductance of the other portion;

an axial slit in said conductive body; and wherein said conductive body comprise a ring coaxial with a coextensive with the one portion of said antenna.

18. The reactor of claim 12 wherein said tap is located unsymmetrically with respect to the two ends of said antenna wherein the one portion having its inductance suppressed by the conductive body is shorter in length than the other portion.

19. A plasma reactor, comprising:

a reactor chamber including a wafer support for holding a semiconductor wafer for processing and a process gas supply inlet;

an RF power generator having an output terminal and a return terminal;

an inductive antenna comprising a coiled conductor adjacent said reactor chamber having first and second spaced apart ground taps coupled to said return terminal of said generator and an intermediate power input tap between said ground taps, said intermediate tap connected to said output terminal and defining first and second portions of said antenna on respective sides of said intermediate tap;

an inductance-suppressing conductive body sufficiently closer to one of said portions of said antenna than it is to the other of said portions to provide greater suppression of the inductance of the one portion and lesser suppression of the inductance of the other portion;

an axial slit in said conductive body; and wherein said intermediate power input conductive portion comprises a metal ring at least nearly coaxial with an axis of symmetry of said coiled conductor, said ring having a length along said axis corresponding to a an axial length of said one portion of said antenna.

20. The reactor of claim 19 further comprising a slit through said ring, whereby said ring does not completely encircle said one antenna portion.

21. The reactor of claim 19 wherein said ring is separated from said one portion of said antenna by about one skin depth of an inductive field of said antenna at a selected frequency of said RF generator.

22. A The reactor of claim 12 wherein said conductive body is sufficiently close to said one portion of said antenna to fix the inductance of said one portion at a level that is at least nearly constant over plasma ignition.

23. The reactor of claim 12 wherein said conductive body is place sufficiently closer to the one antenna portion than to the other portion so that a plasma in said chamber has relatively little effect upon the inductance of said one portion compared to its effect upon the inductance of 1he other portion of said antenna.

24. The reactor of claim 12 wherein said chamber comprises an overhead ceiling facing said wafer support, and wherein said antenna is placed on an external side of said ceiling and faces said wafer support through said ceiling, said conductive body being placed on a side of said antenna opposite said ceiling.

25. The reactor of claim 24 wherein said antenna conforms generally to the shape of an external surface of said ceiling.

26. The reactor of claim 19 wherein said ring has a rectangular cross-sectional shape.

27. A plasma reactor, comprising:

a reactor chamber including a wafer support for holding a semiconductor wafer for processing and a process gas supply inlet;

an RF power generator having an output terminal and a return terminal;

an inductive antenna comprising a coiled conductor adjacent said reactor chamber having first and second spaced apart ground taps coupled to said return terminal of said generator and an intermediate power input tap between said ground taps, said intermediate tap connected to said output terminal and defining first and second portions of said antenna on respective sides of said intermediate tap;

an inductance-suppressing conductive body sufficiently closer to one of said portions of said antenna than it is to the other of said portions to provide greater suppression of the inductance of the one portion and lesser suppression of the inductance of the other portion;

an axial slit in said conductive body;

a third ground tap spaced from said second ground tap and coupled to said return terminal of said generator, said second ground tap being a middle tap of said coil conductor;

a second intermediate power input tap between said second and third ground taps, said intermediate tap connected to said output terminal and deferring third and fourth portions of said antenna on respective sides of said second intermediate power input tap; and a second inductance-suppressing conductive body sufficiently closer to one of said third and fourth portions than it is to the other to provide greater suppression of the inductance of the one portion and lesser suppression of the inductance of the other of said third and fourth portions.

* * * * *